(12) United States Patent
Jabeur et al.

(10) Patent No.: US 11,289,644 B2
(45) Date of Patent: Mar. 29, 2022

(54) MAGNETIC TUNNEL JUNCTION HAVING ALL-AROUND STRUCTURE

(71) Applicant: International Business Machines Corporation, Armonk, NY (US)

(72) Inventors: Kotb Jabeur, Essex Junction, VT (US); Daniel Worledge, San Jose, CA (US); Jonathan Z. Sun, Shrub Oak, NY (US); Pouya Hashemi, Purchase, NY (US)

(73) Assignee: International Business Machines Corporation, Armonk, NY (US)

( * ) Notice: Subject to any disclaimer, the term of this patent is extended or adjusted under 35 U.S.C. 154(b) by 139 days.

(21) Appl. No.: 16/720,133

(22) Filed: Dec. 19, 2019

(65) Prior Publication Data
US 2021/0193910 A1    Jun. 24, 2021

(51) Int. Cl.
*H01L 43/02* (2006.01)
*H01L 43/12* (2006.01)
*H01L 43/10* (2006.01)
*H01L 27/22* (2006.01)

(52) U.S. Cl.
CPC .............. *H01L 43/02* (2013.01); *H01L 43/10* (2013.01); *H01L 43/12* (2013.01); *H01L 27/222* (2013.01)

(58) Field of Classification Search
CPC ......... H01L 42/03; H01L 42/10; H01L 42/12; H01L 27/22
USPC ........................................................ 257/421
See application file for complete search history.

(56) References Cited

U.S. PATENT DOCUMENTS

| | | | |
|---|---|---|---|
| 9,343,658 B2 | 5/2016 | Wang et al. | |
| 9,461,586 B2* | 10/2016 | Locatelli | H03C 3/0958 |
| 10,283,561 B2 | 5/2019 | Wang et al. | |
| 10,333,058 B2 | 6/2019 | Aradhya et al. | |
| 2012/0075031 A1* | 3/2012 | Dieny | H03B 15/006 |
| | | | 331/157 |

(Continued)

FOREIGN PATENT DOCUMENTS

| CN | 101621113 A | 1/2010 |
|---|---|---|
| CN | 103887425 A | 6/2014 |

(Continued)

OTHER PUBLICATIONS

International Search Report dated Mar. 9, 2021 issued in PCT/IB2020/061061, 10 pages.

(Continued)

*Primary Examiner* — Jami Valentine Miller
(74) *Attorney, Agent, or Firm* — Scully, Scott, Murphy & Presser, PC; Daniel P. Morris, Esq.

(57) ABSTRACT

A magnetic tunnel junction (MTJ) device includes a cylindrically-shaped pillar structure and a first ferromagnetic layer disposed on at least a portion of the pillar structure. The first ferromagnetic layer exhibits a magnetization that is changeable in the presence of at least one of an applied bias and heat. The MTJ device further includes a dielectric barrier disposed on at least a portion of the first ferromagnetic layer and a second ferromagnetic layer disposed on at least a portion of the dielectric barrier. The second ferromagnetic layer exhibits a magnetization that is fixed. The MTJ device is configured such that the first and second ferromagnetic layers and the dielectric barrier concentrically surround the pillar structure.

18 Claims, 17 Drawing Sheets

(56) References Cited

U.S. PATENT DOCUMENTS

| | | | |
|---|---|---|---|
| 2014/0175577 A1* | 6/2014 | Apalkov | H01L 43/08 |
| | | | 257/421 |
| 2018/0123031 A1 | 5/2018 | Adelmann et al. | |
| 2018/0151210 A1 | 5/2018 | Li et al. | |
| 2019/0164586 A1 | 5/2019 | Chen et al. | |
| 2019/0172999 A1 | 6/2019 | Chia | |
| 2019/0207084 A1* | 7/2019 | Tzoufras | H01L 43/12 |
| 2019/0207094 A1* | 7/2019 | Gajek | H01L 43/04 |
| 2019/0305212 A1 | 10/2019 | Gosavi et al. | |

FOREIGN PATENT DOCUMENTS

| | | |
|---|---|---|
| CN | 107658382 A | 2/2018 |
| CN | 109273593 A | 1/2019 |
| CN | 110224058 A | 9/2019 |
| WO | 2019005158 A1 | 1/2019 |

OTHER PUBLICATIONS

R. Lo Conte et al., "Spin-Orbit Torque-Driven Magnetization Switching and Thermal Effects Studied in Ta\CoFeB\MgO Nanowires", Applied Physics Letters, 1-8; 2014.

* cited by examiner

MAGNETIC TUNNEL JUNCTION HAVING ALL-AROUND STRUCTURE

BACKGROUND

The present invention relates generally to the electrical, electronic and computer arts, and, more particularly, to magnetic tunnel junction structures.

Magnetic tunnel junctions or MTJs are nanostructured devices within the field of magnetoelectronics or spin electronics, hereafter called spintronics. In this area, the experimental observation of sizable and tunable magnetoresistance (change of materials resistance due to external magnetic fields) is intimately related to the exploitation of not only charge of the electron but also its spin.

A magnetic tunnel junction (MTJ) device, which is a primary storage element in a magnetic random access memory (MRAM), is a magnetic storage and switching device in which two ferromagnetic layers are separated by a thin insulating barrier (e.g., aluminum oxide) to form a stacked structure. One of the ferromagnetic layers has a magnetization that is fixed, and is therefore referred to as a fixed or pinned layer, while the other ferromagnetic layer has a magnetization that can change, and is therefore referred to as a free layer. When a bias is applied to the MTJ device, electrons that are spin polarized by the ferromagnetic layers traverse the insulating barrier through a process known as tunneling to generate an electric current whose magnitude depends on an orientation of magnetization of the ferromagnetic layers. The MTJ device will exhibit a low resistance when a magnetic moment of the free layer is parallel to the fixed layer magnetic moment, and will exhibit a high resistance when the magnetic moment of the free layer is oriented anti-parallel to the fixed layer magnetic moment.

The materials and geometry used to build the stack of different layers forming the MTJ device are among the most important parameters for defining the characteristics of the device in terms of speed (i.e., switching time) and power consumption (e.g., voltage and/or current required to switch the device from one state to another). The typical structure of an MTJ is a pillar (i.e., stack of materials) having a cylindrical shape, where current flows from a top layer to a bottom layer, or vice versa, in order to switch the magnetization of one ferromagnetic layer; this is referred to as a spin transfer torque (STT) device. Another form of an MTJ is referred to as a spin orbit torque (SOT) device. In the SOT device, the pillar is still cylindrically shaped but is deposited on top of a heavy metal conductor. Current flows horizontally in this conductor and switches the magnetization of the ferromagnetic layer at the interface.

In both the STT and the SOT MTJ devices, which have cylindrically shaped stacks, the surface area of the interface is equal to the area of a circle ($A=\pi r^2$, where A is the area of the interface and r is the radius of the cylinder stack). In the current state of the art, the required energy (power×time) to switch the state of the MTJ device is still relatively high, which is undesirable.

SUMMARY

The present invention, as manifested in one or more embodiments, beneficially provides a magnetic tunnel junction (MTJ) structure, and methods for fabricating an MTJ structure, having an all-around configuration such that the ferromagnetic layers and barrier layer surround each other, rather than being in a stacked arrangement. This structure, which may be formed in a manner consistent with a nanowire, beneficially increases the interface area between the free layer and spin orbit torque (SOT) metal, thereby providing enhanced switching efficiency.

In accordance with an embodiment of the invention, an MTJ device having an all-around structure includes a cylindrically-shaped pillar structure and a first ferromagnetic layer disposed on at least a portion of the pillar structure. The first ferromagnetic layer exhibits a magnetization that is changeable in the presence of at least one of an applied bias and heat. The MTJ device further includes a dielectric barrier disposed on at least a portion of the first ferromagnetic layer and a second ferromagnetic layer disposed on at least a portion of the dielectric barrier. The second ferromagnetic layer exhibits a magnetization that is fixed. The MTJ device is configured such that the first and second ferromagnetic layers and the dielectric barrier concentrically surround the pillar structure.

In accordance with an embodiment of the invention, a method of forming an MTJ device having an all-around structure includes: forming a cylindrically-shaped pillar structure; forming a first ferromagnetic layer on at least a portion of the pillar structure, the first ferromagnetic layer having a magnetization that is changeable in the presence of at least one of an applied bias and heat; forming a dielectric barrier on at least a portion of the first ferromagnetic layer; forming a second ferromagnetic layer on at least a portion of the dielectric barrier, the second ferromagnetic layer having a magnetization that is fixed; wherein the first and second ferromagnetic layers and the dielectric barrier concentrically surround the pillar structure.

Techniques of the present invention can provide substantial beneficial technical effects. By way of example only and without limitation, an MTJ according to one or more embodiments of the invention may provide one or more of the following advantages:

increased interface area between the free layer and SOT metal;
faster switching speed;
enhanced power efficiency; and
increased cell density, since the SOT metal is grown vertically.

These and other features and advantages of the present invention will become apparent from the following detailed description of illustrative embodiments thereof, which is to be read in connection with the accompanying drawings.

BRIEF DESCRIPTION OF THE SEVERAL VIEWS OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention, as manifested in one or more embodiments, will be described herein in the context of an illustrative magnetic tunnel junction (MTJ) device, and methods for fabricating an MTJ device, having an all-around structure that beneficially increases an interface area between layers, thereby providing enhanced switching efficiency. It is to be appreciated, however, that the invention is not limited to the specific device and/or methods illustratively shown and described herein. Rather, it will become apparent to those skilled in the art given the teachings herein that numerous modifications can be made to the embodiments shown that are within the scope of the claimed invention. That is, no limitations with respect to the embodiments shown and described herein are intended or should be inferred.

Figure 1A:
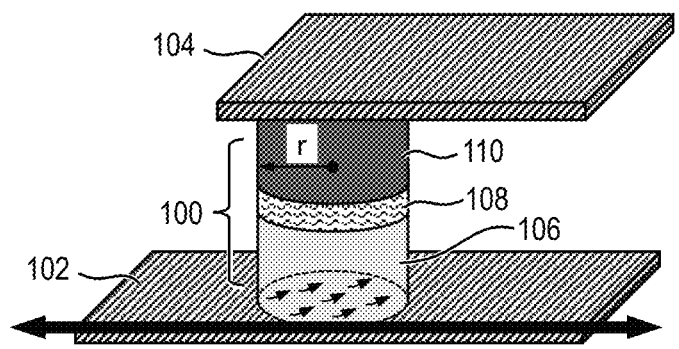
FIG. 1A is a perspective view depicting at least a portion of a standard spin orbit torque (SOT) magnetic tunnel junction (MTJ) device.
Figure 1B:
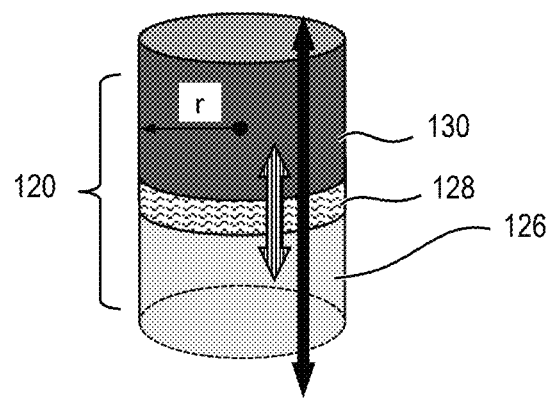
FIG. 1B is a perspective view depicting at least a portion of a standard spin transfer torque (STT) MTJ device.

FIGS. 1A and 1B are perspective views depicting at least a portion of a standard spin orbit torque (SOT) magnetic tunnel junction (MTJ) device 100 and spin transfer torque (STT) MTJ device 120, respectively. With reference to FIG. 1A, the SOT MTJ device 100 is shown sandwiched between a first conductor 102 and a second conductor 104. The MTJ device 100 is formed as a cylindrical pillar or stack structure including a first ferromagnetic material layer 106, which may be a free layer, in electrical contact with the first conductor 102, a dielectric barrier 108 formed on the first ferroelectric material layer, and a second ferroelectric material layer 110, which may be a fixed or pinned layer, formed on the dielectric barrier. As previously stated, the fixed layer 110 has a magnetization that is fixed and the free layer 106 has a magnetization that can change in the presence of an applied bias and/or heat. Similarly, as shown in FIG. 1B, the STT MTJ device 120 is formed as a cylindrical pillar/stack structure including a first ferroelectric material layer 126, a dielectric barrier 128 formed on the first ferroelectric material layer, and a second ferroelectric material layer 130 formed on the dielectric barrier.

Depending on the materials used to form the different layers in the MTJ device and the materials used for the conductors, the switching of the free layer can be enabled by SOT or STT or both mechanisms. In either case, the switching mechanism is triggered at an interface between two material layers in the stack. Since the stack forming the MTJ devices 100, 120 is cylindrical in shape, the interface area between any two layers will be $\pi r^2$, where r is a radius of the stack. The amount of energy required to switch the magnetization of the MTJ device is directly proportional to this interface area.

Figure 2:
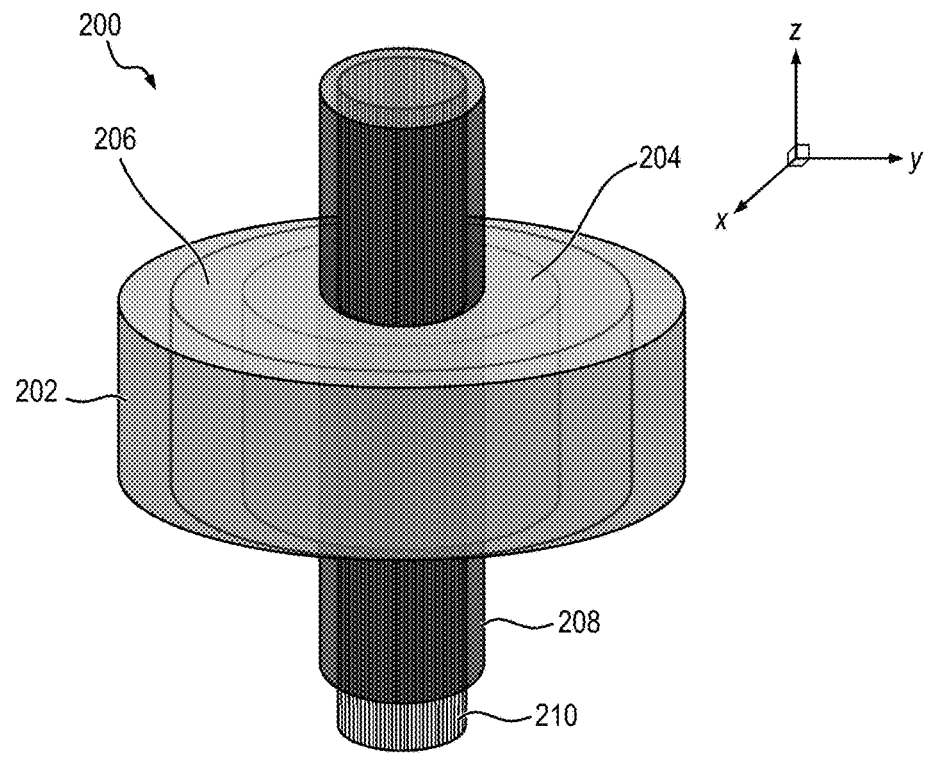
FIG. 2 is a perspective view depicting at least a portion of an exemplary SOT MTJ device having an all-around structure, according to an embodiment of the present invention.

In order to increase the interface area, and thereby improve switching efficiency in the MTJ device, aspects of the present invention, as manifested in one or more embodiments thereof, beneficially provide an MTJ device having an all-around structure, such that the ferromagnetic layers and barrier layer concentrically surround each other rather than being disposed in a stacked arrangement. FIG. 2 is a perspective view depicting at least a portion of an exemplary MTJ device 200 having an all-around structure, according to an embodiment of the invention. The MTJ device 200 uses an SOT-based switching mechanism. While embodiments of the invention are not limited to any specific number of material layers, the basic MTJ embodiment shown in FIG. 2 includes four principal layers for clarity of description, including a reference ferromagnetic layer 202 with unchanged magnetization (spins up or down), referred to herein as a fixed or pinned layer, a free ferromagnetic layer 204 with reconfigurable magnetization (e.g., spins can be flipped up or down using an applied bias current and/or voltage), referred to herein as a free layer, a barrier 206 disposed between the fixed layer 202 and the free layer 204, and a conductor 208 which is arranged through a center of the MTJ device 200, such that the fixed and free layers and barrier concentrically surround the conductor.

In one or more embodiments, the conductor 208 comprises an SOT metal, which is preferably a heavy metal such as, for example, tungsten (W), platinum (Pt), tantalum (Ta), etc. The conductor 208 may be formed as a thin shell of SOT metal (e.g., about 2-20 nanometers (nm) thick) disposed on an insulator core 210. The insulator core 210, which may be a cylindrically-shaped central nanowire oriented along a major axis that is substantially vertical (z-axis), preferably comprises a suitable dielectric material (e.g., silicon dioxide, silicon nitride (SiN), silicon oxynitrate ($SiO_xN_y$), etc.) about 20-100 nm in diameter and about 50-200 nm in height, although embodiments of the invention are not limited to any specific materials or dimensions of the insulator core.

In one or more embodiments, the free layer 204, which may comprise a suitable magnetic material such as, for example, cobalt, iron, boron, or a combination thereof, is disposed on a surface of at least a portion of the conductor 208 and surrounds the conductor like a toroid. The barrier 206, which, in the case of an SOT MTJ device, may comprise an insulating material such as, for example, magnesium oxide (MgO), aluminium oxide ($AlO_x$), magnesium aluminate or magnesium aluminium oxide ($MgAlO_x$), or a combination thereof, is disposed on a surface of the free layer 204 and surrounds the free layer like a toroid. The fixed layer 202, which may comprise a suitable magnetic material such as, for example, cobalt, iron, boron, platinum, nickel, tungsten, iridium, or a combination thereof, is disposed on a surface of at least a portion of the barrier 206 and surrounds the barrier like a toroid; the fixed layer 202 is electrically isolated from the free layer 204 by the barrier 206.

The free layer 204 is the layer directly contacting and thus forming an interface with the SOT conductor 208. By passing a current through the conductor 208 in one direction or another, a physical phenomenon will occur at the interface with the free layer 204 which may switch an orientation (i.e., direction) of magnetization of the free layer depending on the direction of the current. This change in magnetization of the free layer 204 will cause the overall MTJ device 200 to exhibit a change in resistance.

Figure 3A:
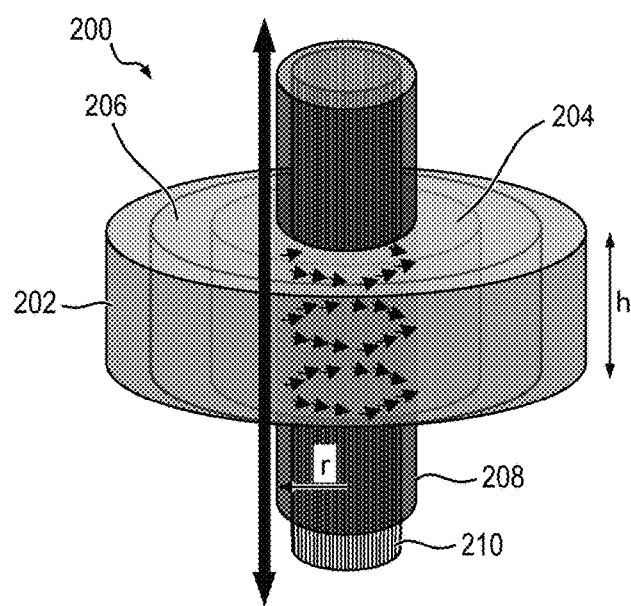
FIGS. 3A and 3B are perspective and top plan views, respectively, depicting at least a portion of the exemplary SOT MTJ device shown in FIG. 2, conceptually illustrating an increased interface area, according to an embodiment of the present invention.
Figure 3B:
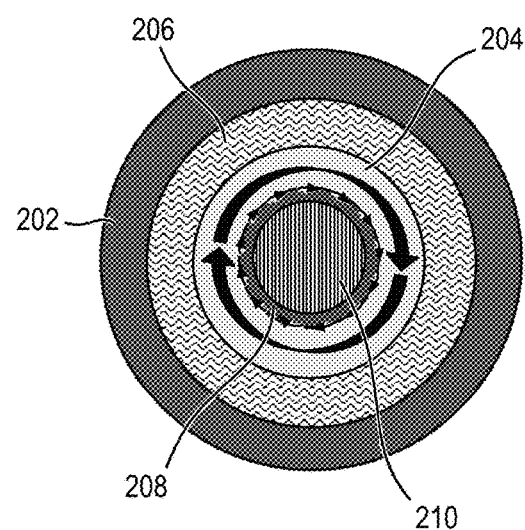

By forming the MTJ device in accordance with embodiments of the invention, wherein the various layers of the MTJ device are arranged concentrically around the central nanowire conductor 208 in an all-around configuration, the interface between adjacent layers will be substantially increased compared to the circular area of a conventional MTJ stack. More particularly, with reference to FIGS. 3A and 3B, since the interface between the free layer 204 and conductor 208 follows a circumference of the conductor, the area of the interface will be $2\pi r$, where r is a radius of the conductor, multiplied by a height, h, of the free layer (i.e., $A=2\pi rh$). Thus, the surface area of the interface between the free layer 204 and the conductor 208, and hence a switching efficiency of the MTJ device, can be controlled as a function of both the radius of the conductor and the height of the free layer, which represents a significantly greater area relative to a standard MTJ stack of comparable dimensions. In addition to providing a substantial increase in the interface area between the free layer 204 and the conductor 208, the circumferential magnetization of the free layer in the all-around structure of the MTJ device 200 advantageously achieves enhanced stability.

By way of example only and without limitation, FIGS. 4 through 19 are cross-sectional views depicting exemplary processing steps/stages in the fabrication of an exemplary MTJ device 400 having an all-around structure, according to embodiments of the invention. Although the overall fabrication method and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, many of the processing steps and tooling used to fabricate semiconductor devices are also described in a number of readily available publications, including, for example: P. H. Holloway et al., *Handbook of Compound Semiconductors: Growth, Processing, Characterization, and Devices*, Cambridge University Press, 2008; and R. K. Willardson et al., *Processing and Properties of Compound Semiconductors*, Academic Press, 2001, which are both hereby incorporated herein by reference in their entireties for all purposes. It is emphasized that while some individual processing steps are set forth herein, those steps are merely illustrative, and one skilled in the art may be familiar with several equally suitable alternatives that would also fall within the scope of the invention.

It is to be appreciated that the various layers and/or regions shown in the accompanying figures may not be drawn to scale. Furthermore, one or more semiconductor layers of a type commonly used in such semiconductor devices may not be explicitly shown in a given figure to facilitate a clearer description. This does not imply that the semiconductor layer(s) not explicitly shown are omitted in the actual device.

Figure 4:
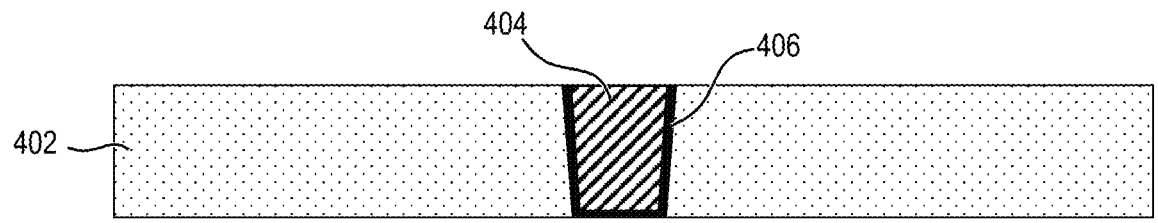
FIGS. 4 through 19 are cross-sectional views depicting exemplary processing steps/stages in the fabrication of an exemplary MTJ device having an all-around structure, according to an embodiment of the present invention.

With reference now to FIG. 4, processing of the illustrative all-around MTJ device 400 starts with a complementary metal-oxide semiconductor (CMOS) wafer with $n^{th}$ level metallization, where n is an integer representing a particular metallization level in the wafer. The $n^{th}$ level metallization (Mn level) includes a dielectric material layer 402 (e.g., silicon dioxide ($SiO_x$), ceramic precursor polyborosilazane (SiBCN), silicon nitride (SiN), or a combination thereof) and a Mn metal connection 404 (e.g., tantalum nitride (TaN), titanium nitride (TiN), tungsten (W), copper (Cu), ruthenium (Ru), cobalt (Co), tantalum (Ta), titanium (Ti), or any combination thereof), which may be patterned using standard lithography and etching. The metal connection 404 may be formed, in one or more embodiments, by etching an opening through the dielectric material layer 402, depositing an optional liner 406 on sidewalls and a bottom of the opening, and filling the opening with metal 406.

Figure 5:
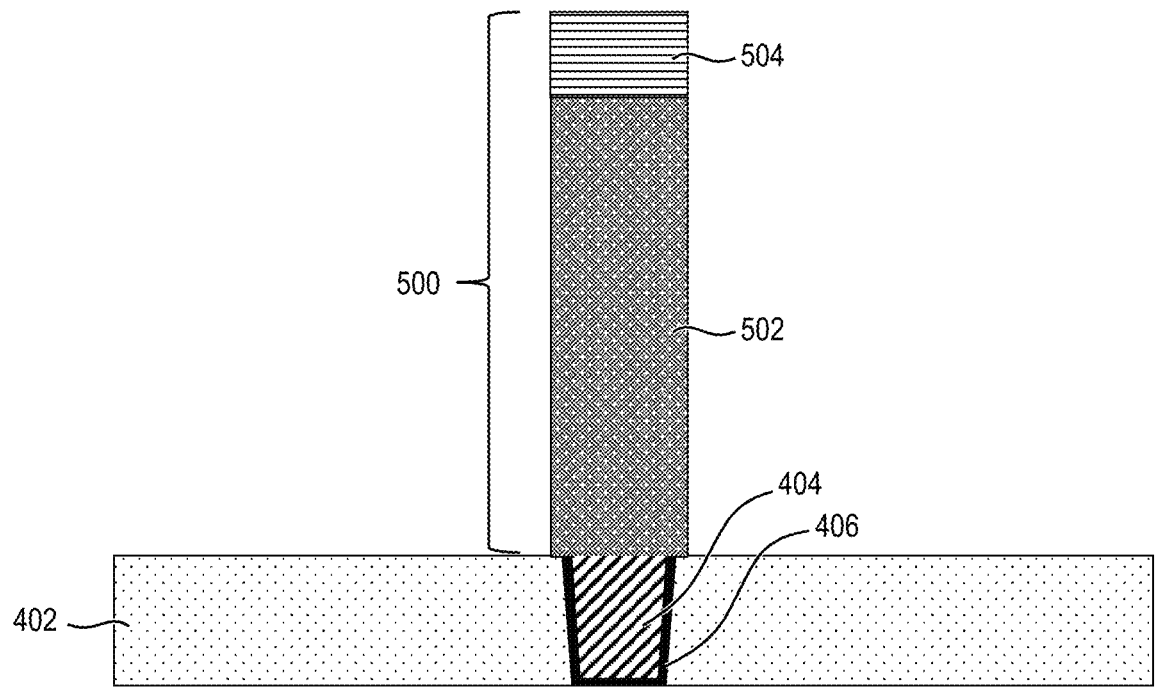

FIG. 5 shows the formation of a dummy core 500 on an upper surface of the metal connection 404. The dummy core 500, in one or more embodiments, is formed by depositing a layer of dummy amorphous silicon 502 following by deposition of a hard mask layer 504 on a portion of an upper surface of the amorphous silicon layer in a desired pattern. The hard mask layer 504 preferably comprises a silicon oxide compound ($SiO_x$), although other materials may be similarly employed (e.g., silicon nitride). The dummy core 500 is then patterned using lithography and anisotropic reactive ion etching (RIE) to form a pillar that is preferably substantially cylindrical in shape. In one or more embodiments, the height of the pillar is about 50-200 nm and the diameter of the pillar is about 20-100 nm, although embodiments of the invention are not limited to any specific dimensions.

Figure 6:
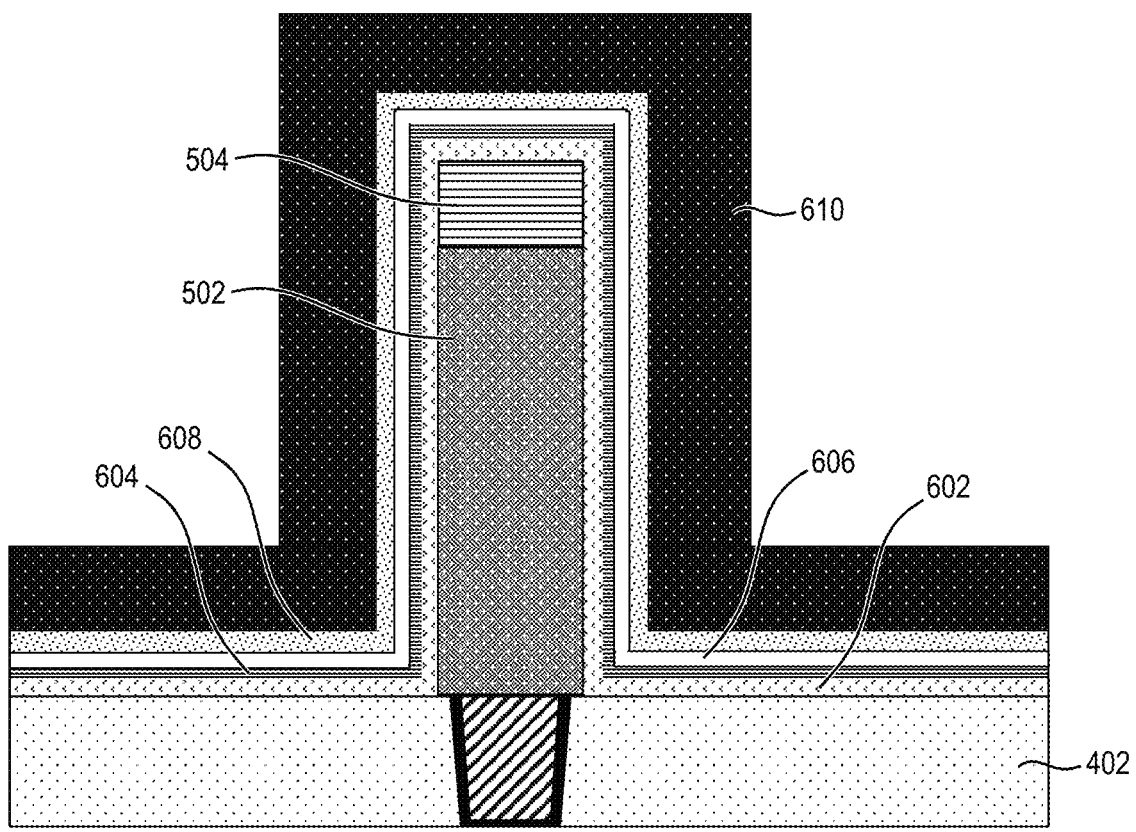

In FIG. 6, principal layers of the MTJ device are deposited. Specifically, a thin layer of SOT metal 602 is deposited on at least a portion of an upper surface of the dielectric material layer 402 and dummy core 500, including sidewalls of the amorphous silicon 502 pillar and sidewalls and upper surface of the hard mask layer 504. Next, a free layer 604 is deposited on at least a portion of an upper surface of the SOT metal layer 602, a tunnelling barrier 606 is deposited on at least a portion of an upper surface of the free layer 604, and a reference (i.e., fixed or pinned) layer 608 is deposited on at least a portion of an upper surface of the tunnelling barrier 606. In one or more embodiments, the SOT metal layer 602 comprises tungsten with a deposited thickness of about 2-20 nm, the free layer 604 comprises cobalt, iron, boron, or a combination thereof, having a deposited thickness of about 2-10 nm, the tunnelling barrier 606 comprises magnesium oxide (MgO), aluminium oxide ($AlO_x$), magnesium aluminate ($MgAlO_x$), or a combination thereof, with a deposited thickness of about 0.4-2 nm, and the reference layer 608 comprises cobalt, iron, boron, platinum, nickel, tungsten, iridium, or a combination thereof, with a deposited thickness of about 5-50 nm. It is to be appreciated, however, that embodiments of the invention are not limited to the specific material types or dimensions of the various MTJ device layers.

Next, a metallic hard mask layer 610 is deposited on at least a portion of an upper surface of the reference layer 608. The metallic hard mask layer 610, in one or more embodiments, preferably comprises, for example, titanium nitride (TiN), tantalum nitride (TaN), ruthenium, or a combination thereof, and has a deposited thickness of about 5-30 nm. Each of the MTJ device layers 604, 606, 608, SOT metal layer 602, and hard mask layer 610, may be formed using a known deposition technique, including, but not limited to, sputtering, atomic layer deposition (ALD), plasma ALD, or a combination thereof. The MTJ device layers 604, 606, 608, SOT metal layer 602, and hard mask layer 610 surrounding the amorphous silicon pillar 502 result in the formation of an MTJ stack.

Figure 7:
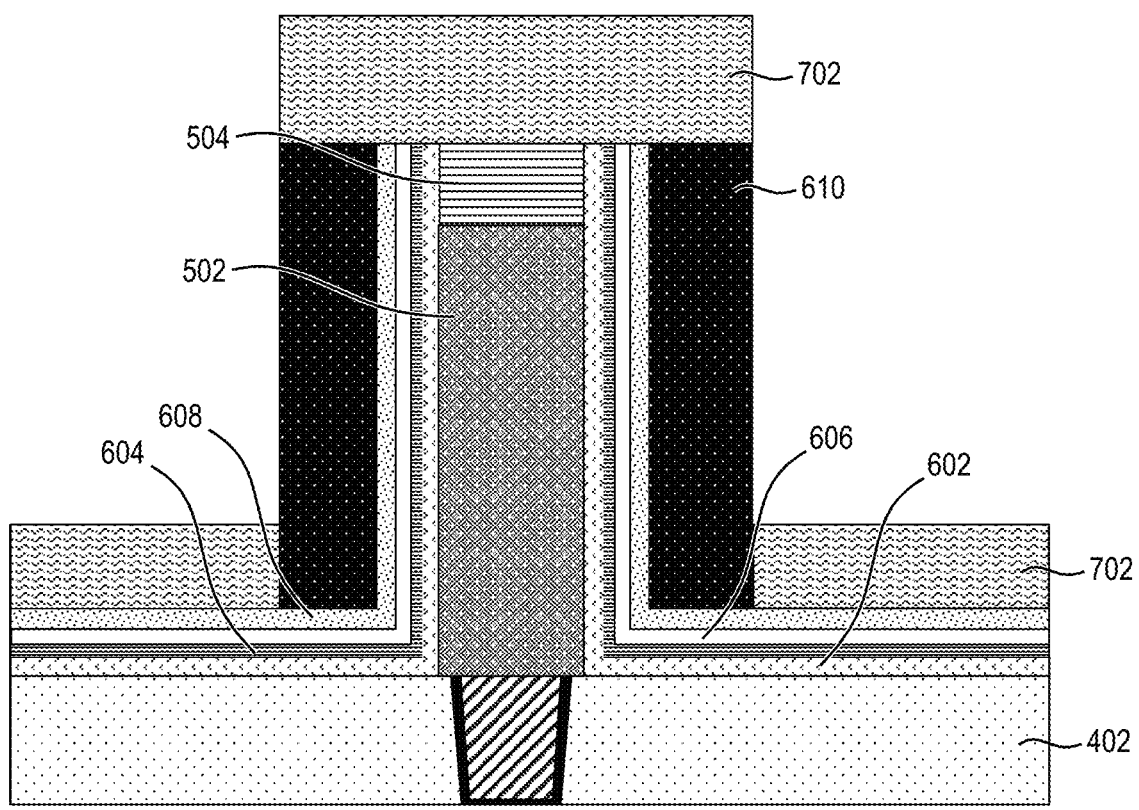

With reference now to FIG. 7, portions of the hard mask layer 610 disposed on horizontal surfaces of the MTJ structure are removed using, for example, directional etching or chemical mechanical polishing or planarization (CMP), leaving the hard mask layer 610 on vertical sidewalls of the MTJ stack. A dummy dielectric layer 702 is subsequently formed on horizontal surfaces of the MTJ structure, including at least a portion of the upper surface of the dielectric material layer 402 and an upper surface of the MTJ stack (i.e., capping the SOT metal layer 602, MTJ device layers 604, 606, 608, and hard mask layer 610). In one or more embodiments, the dummy dielectric layer 702 is formed using, for example, a directional deposition of dielectric material (e.g., silicon nitride) followed by an isotropic etch to remove any dielectric material deposited on the vertical surfaces (e.g., sidewalls) of the MTJ stack. A final thickness of the structure will be larger than a thickness of the MTJ stack (e.g., about 20-50 nm).

Figure 8:
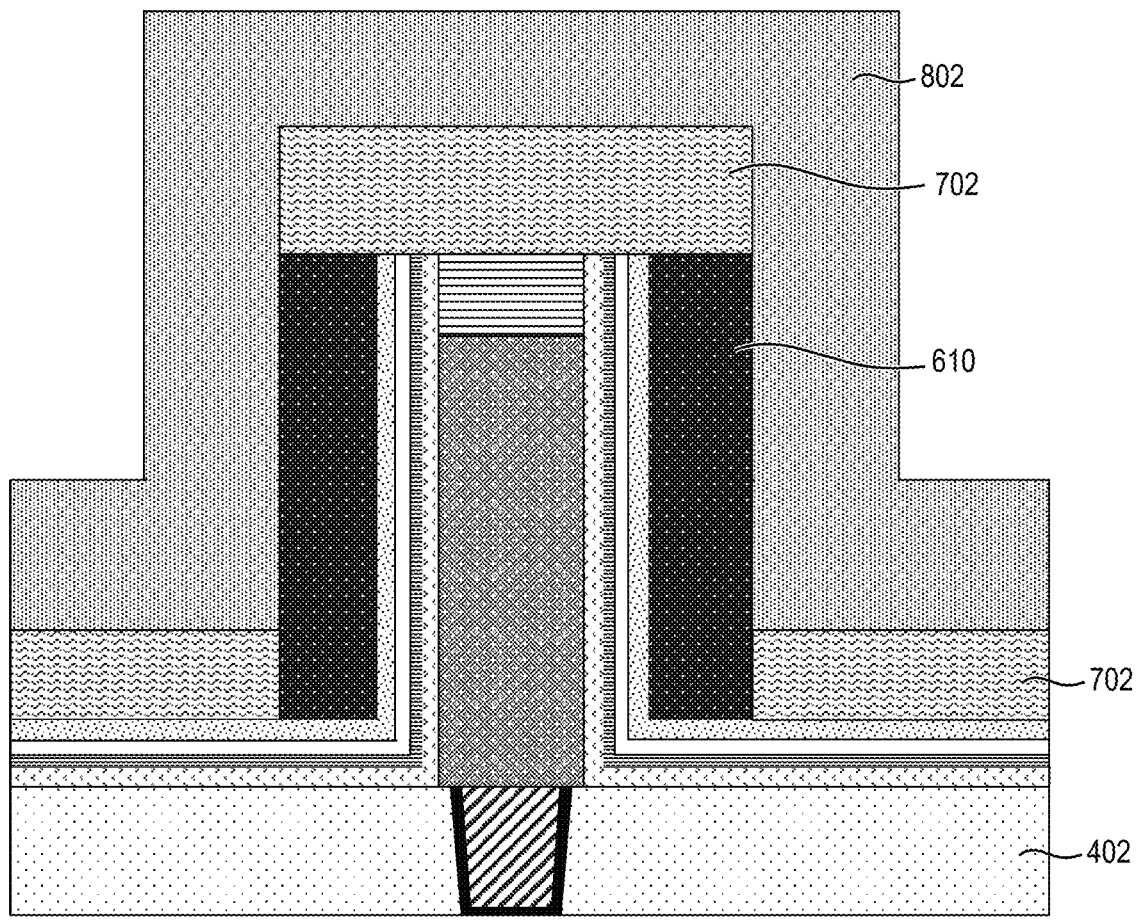

FIG. 8 illustrates the deposition of a conformal dielectric layer 802 over an upper surface of the MTJ structure, including an upper surface of the dummy dielectric layer 702, formed on the upper surface of the dielectric material layer 402 and upper surface of the MTJ stack, and sidewalls 610 and of the MTJ stack. The conformal dielectric layer 802 may comprise, for example, $SiO_x$, SiBCN, etc., and primarily serves to protect the metallic hard mask layer 610 in a subsequent processing step. A thickness of the conformal dielectric layer 802 is preferably about 30-100 nm, although embodiments of the invention are not limited to any particular dimensions of the conformal dielectric layer.

Figure 9:
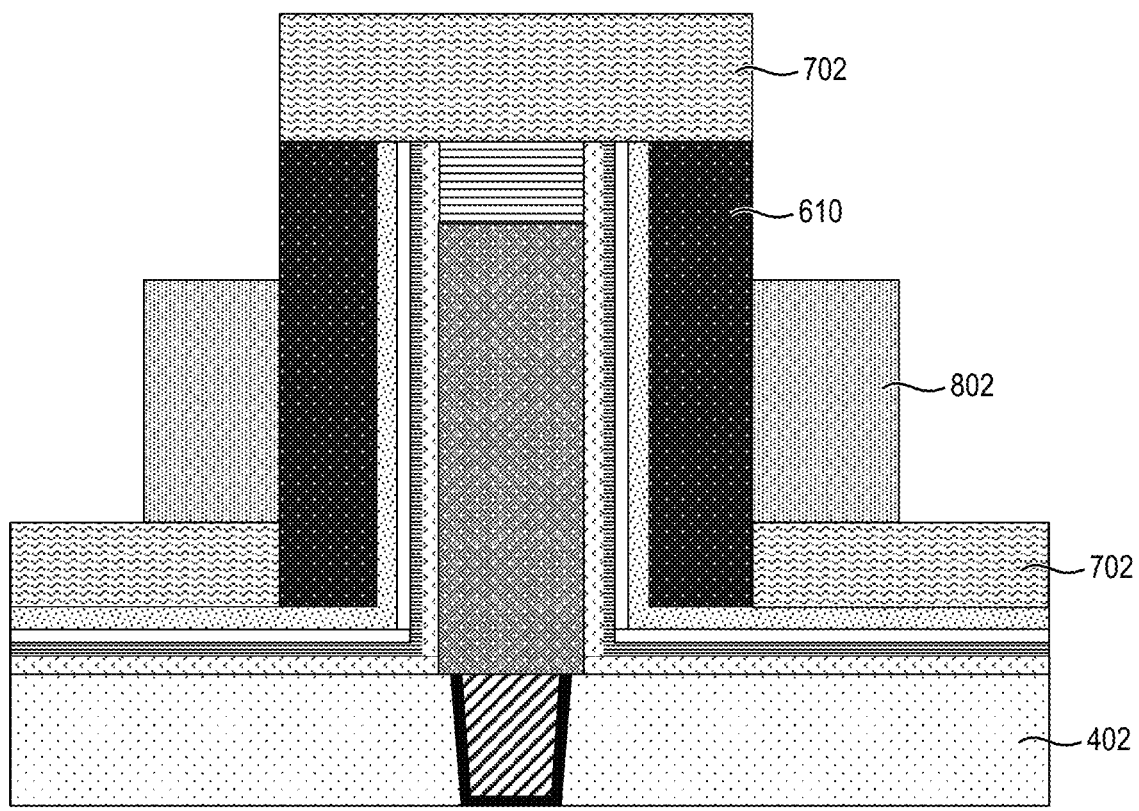

RIE is then performed to remove portions of the conformal dielectric layer 802 on horizontal surfaces of the MTJ structure, including the conformal dielectric layer disposed on the upper surface of the MTJ stack and at least a portion of the conformal dielectric layer formed on the upper surface of the dummy dielectric layer 702, as shown in FIG. 9. The remaining portion of the conformal dielectric layer 802 disposed on the sidewalls of the MTJ stack is recessed, for example using an anisotropic (i.e., directional) etch, thereby exposing a portion of the dummy dielectric layer 702 formed on the upper surface of the MTJ stack and a top portion of the hard mask layer 610 disposed on the sidewalls of the MTJ stack. This RIE of the conformal dielectric layer 802 may be performed in a manner consistent with a CMOS spacer process. In one or more embodiments, the conformal dielectric layer 802 is recessed to about 30-100 nm, although embodiments of the invention are not limited to any specific dimensions of the conformal dielectric layer.

Figure 10:
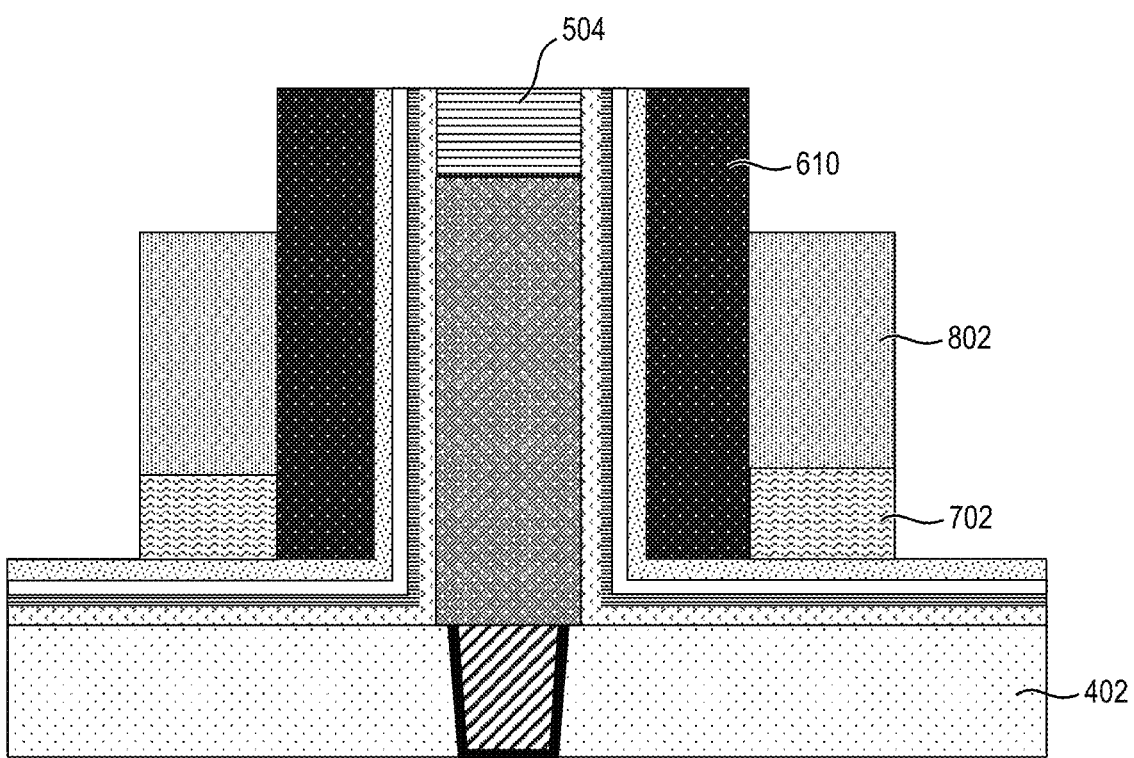
Figure 11:
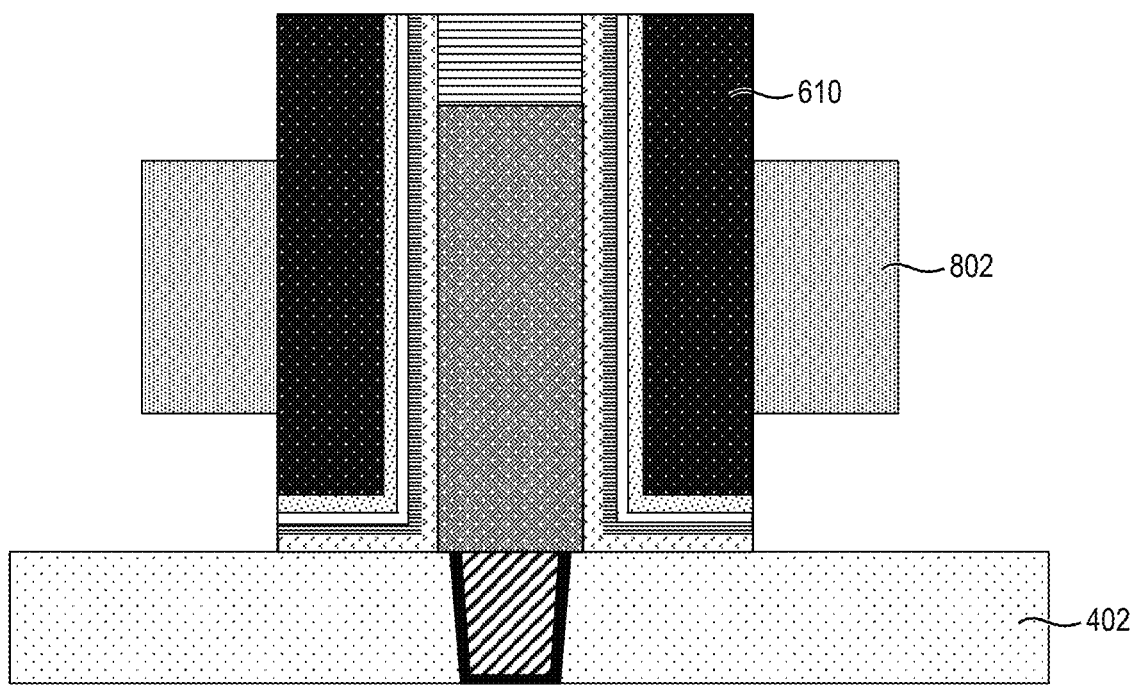

In FIG. 10, a selective anisotropic RIE is performed to remove portions of the dummy dielectric layer 702. Specifically, the dummy dielectric layer 702 capping the upper surface of the MTJ stack and portions of the dummy dielectric layer formed on the dielectric material layer 402 not covered by the conformal dielectric layer 802 are removed. Next, a selective isotropic RIE is performed to remove the remaining dummy dielectric layer 702 disposed under the conformal dielectric layer 802, as shown in FIG. 11.

Figure 12:
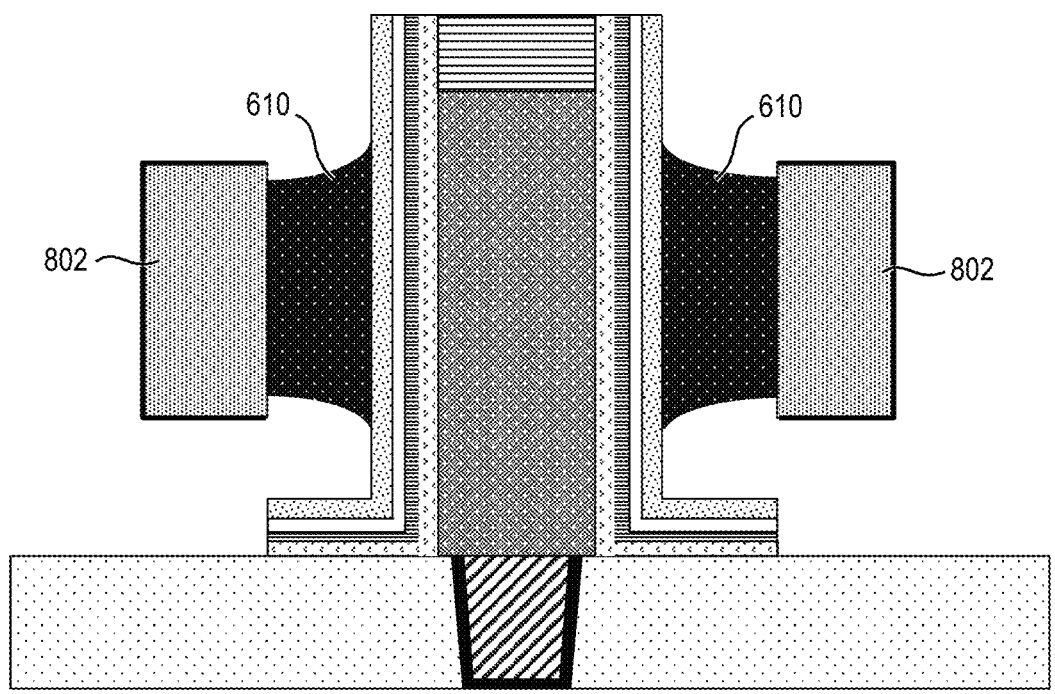

With reference to FIG. 12, an isotropic etch is performed to remove portions of the metallic hard mask layer 610 not protected by the conformal dielectric layer 802. In one or more embodiments, the isotropic etch may be accomplished using, for example, RIE or wet etching or a combination of RIE and wet etching.

Figure 13A:
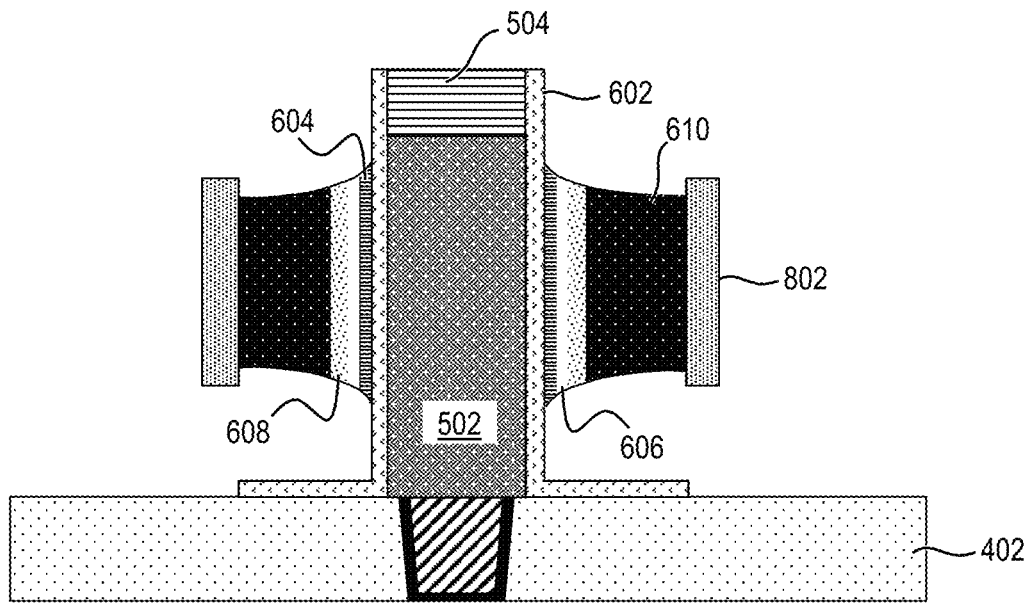
Figure 13B:
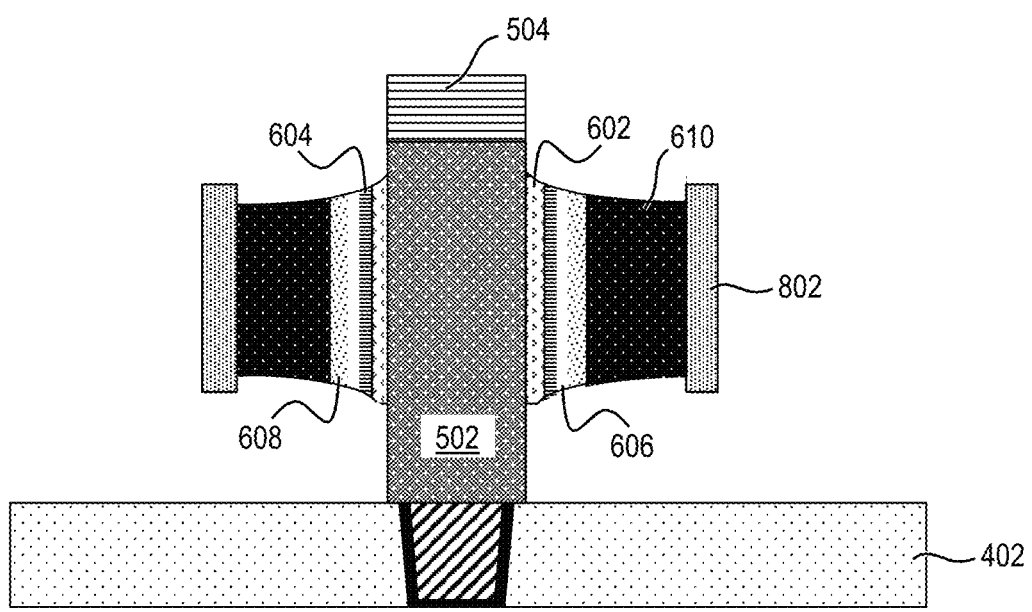

As depicted in FIGS. 13A and 13B, an isotropic etch of the MTJ stack with cyclic oxidation/removal is performed using, for example, RIE only and RIE and organic wet etching, to remove portions of MTJ device layers 604, 606 and 608 not protected by the hard mask layer 610. Alternatively, a highly-angled ion beam etch can be used to remove the portions of the MTJ device layers, resulting in a slightly different profile (not explicitly shown). In one or more embodiments, the etching process can be end-pointed using the SOT metal layer 602 as an etch stop layer, as shown in FIG. 13A. In this embodiment, the SOT metal layer 602 remains essentially intact. In an alternative embodiment, the SOT metal layer 602 can be etched along with the MTJ device layers 604, 606, 608, as shown in FIG. 13B, such that only the SOT metal layer protected by the hard mask layer 610 remains. Subsequent processing steps will be described with reference to the embodiment shown in FIG. 13B, although each of these subsequent processing steps apply similarly to the embodiment shown in FIG. 13A, as will become apparent to those skilled in the art.

Figure 14:
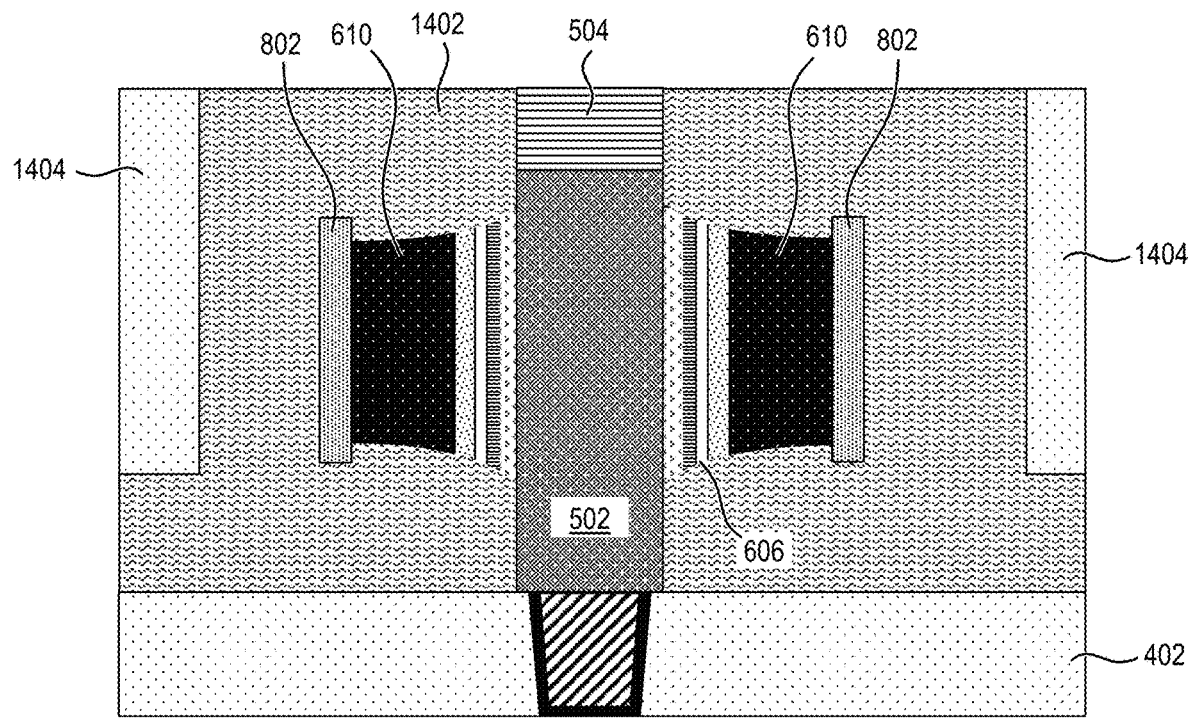

In FIG. 14, an encapsulation dielectric layer 1402 is formed on at least a portion of the dielectric material layer 402 and entirely surrounding the MTJ device structure. The encapsulation dielectric layer 1402 may comprise silicon nitride, although other dielectric materials may be similarly employed. Optionally, one or more interlayer dielectric (ILD) structures 1404 may be formed in the encapsulation dielectric layer 1402 to electrically isolate the MTJ device from adjacent conductive structures and/or devices. The ILD structures 1404 are formed of a dielectric material, such as, for example, $SiO_x$, SiBCN, SiN, or a combination thereof, although embodiments of the invention are not limited to any specific dielectric material. In one or more embodiments, CMP is then performed to planarize the upper surface of the MTJ structure. CMP may be performed until at least a portion of an upper surface of the hard mask layer 504 is exposed.

Figure 15:
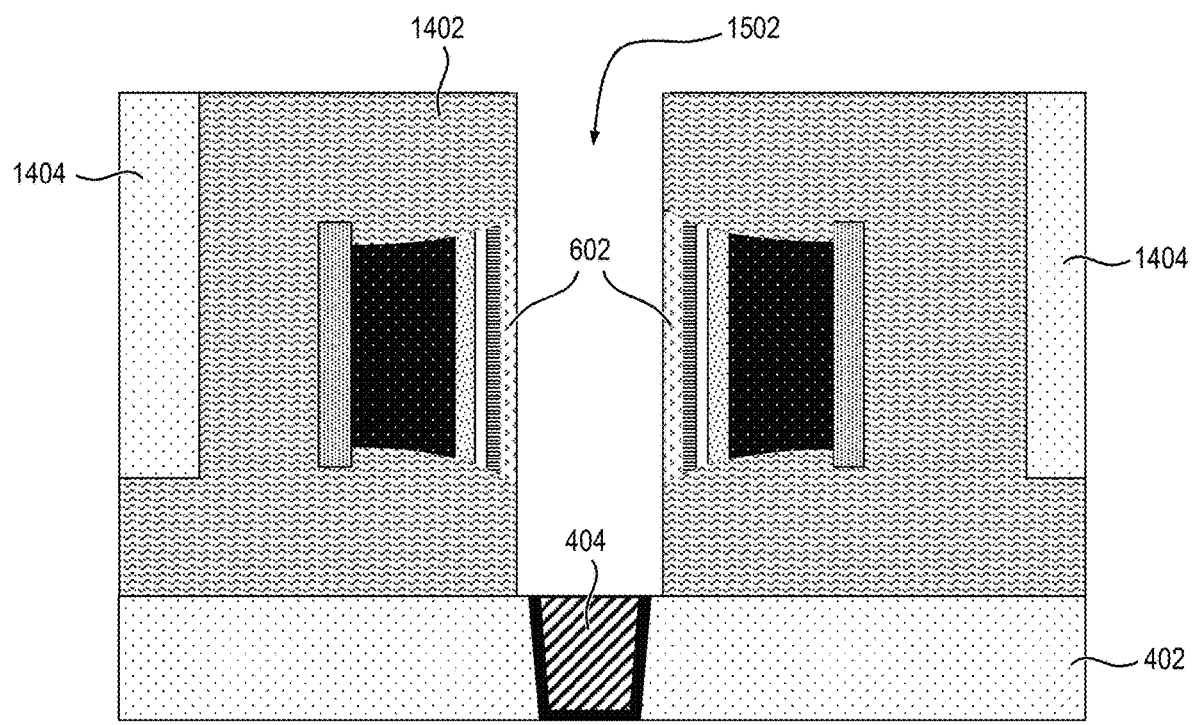

Subsequently, as illustrated in FIG. 15, the dummy core (500 shown in FIG. 5), which includes the hard mask layer and dummy amorphous silicon pillar (504 and 502, respectively, in FIG. 5) is removed leaving an opening 1502 through which an upper surface of the underlying metal connection 404, as well as vertical walls of the SOT metal 602, are exposed. In one or more embodiments, the dummy core may be removed to thereby form the opening 1502 using a known etching process, such as, but not limited to, RIE, wet etching, or a combination thereof, using, for example, tetramethylammonium hydroxide (TMAH), diluted hydrofluoric acid (DHF), or similar etchants, as will be known to those skilled in the art.

Figure 16:
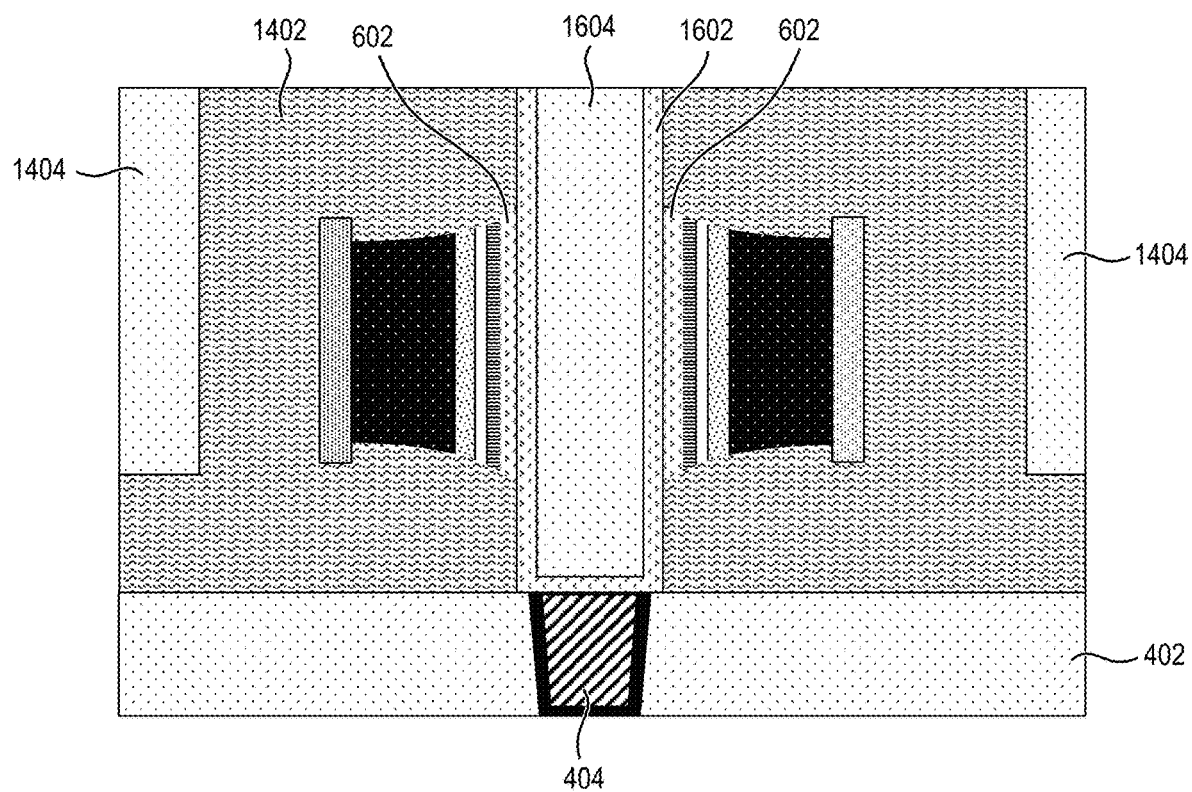
Figure 17:
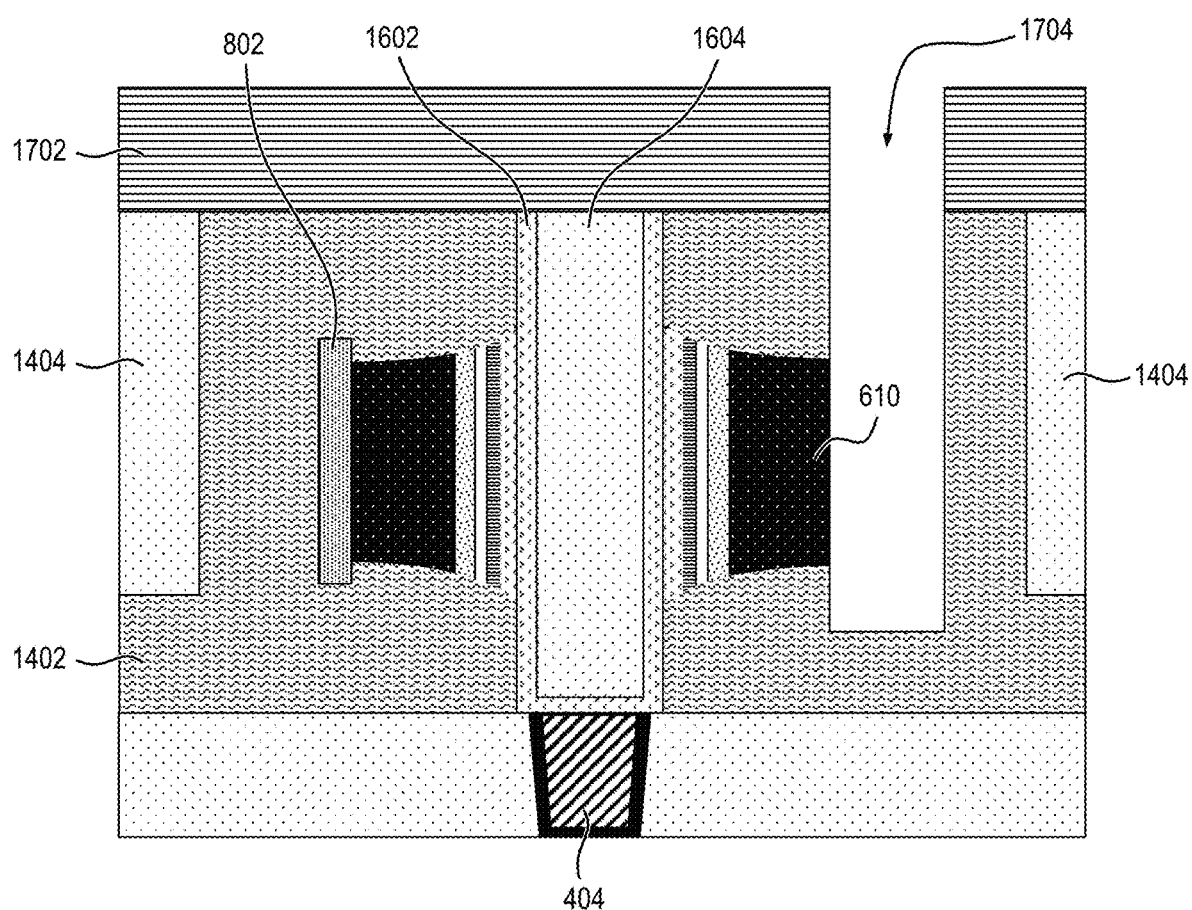

With reference now to FIG. 16, a layer of SOT metal 1606 is deposited on sidewalls and a bottom of the opening 1502, thereby effectively lining the inner surfaces of the opening. With the SOT metal 602 and metal connection 404 exposed, the SOT metal layer 1602 will be electrically connected with the SOT metal 602 and metal connection 404 so as to form an SOT metal extension in the opening 1502. The SOT metal extension 1602 essentially forms a via providing electrical contact with the underlying metal connection 404. In one or more embodiments, the SOT metal extension 1602 comprises tungsten having a thickness of about 2-5 nm, although embodiments of the invention are not limited to any specific metal types or dimensions. Once the SOT metal extension 1602 is formed, the opening 1502 is filled with a core dielectric material 1604 and is planarized using CMP or a similar planarization/polishing process so that the SOT metal extension and core dielectric material are substantially even with the upper surface of the encapsulation dielectric layer 1402.

A photoresist layer 1702 is formed over the semiconductor wafer, including on at least a portion of the upper surfaces of the encapsulation dielectric layer 1402, ILD structures 1404, SOT metal extension 1602 and core dielectric material 1604. This photoresist layer 1702 is then patterned, using standard lithography and etching, to form at least one opening 1704 through the photoresist layer and at least partially through the encapsulation dielectric layer 1402. In the process of forming the opening 1704, which in one or more embodiments is accomplished using ILD RIE and oxide RIE, or the like, the conformal dielectric layer 802 on at least one side of the MTJ device is removed, thereby exposing at least a portion of the adjacent metallic hard mask layer 610, on which the conformal dielectric layer is formed, through a sidewall of the opening 1704. This opening 1704 will be subsequently used to form an MTJ device contact. It is to be appreciated that although only one MTJ device contact is shown in this illustrative embodiment, in one or more embodiments, multiple MTJ device contacts can be formed. One advantage to forming multiple MTJ device contacts is that it can be shared or isolated.

Figure 18:
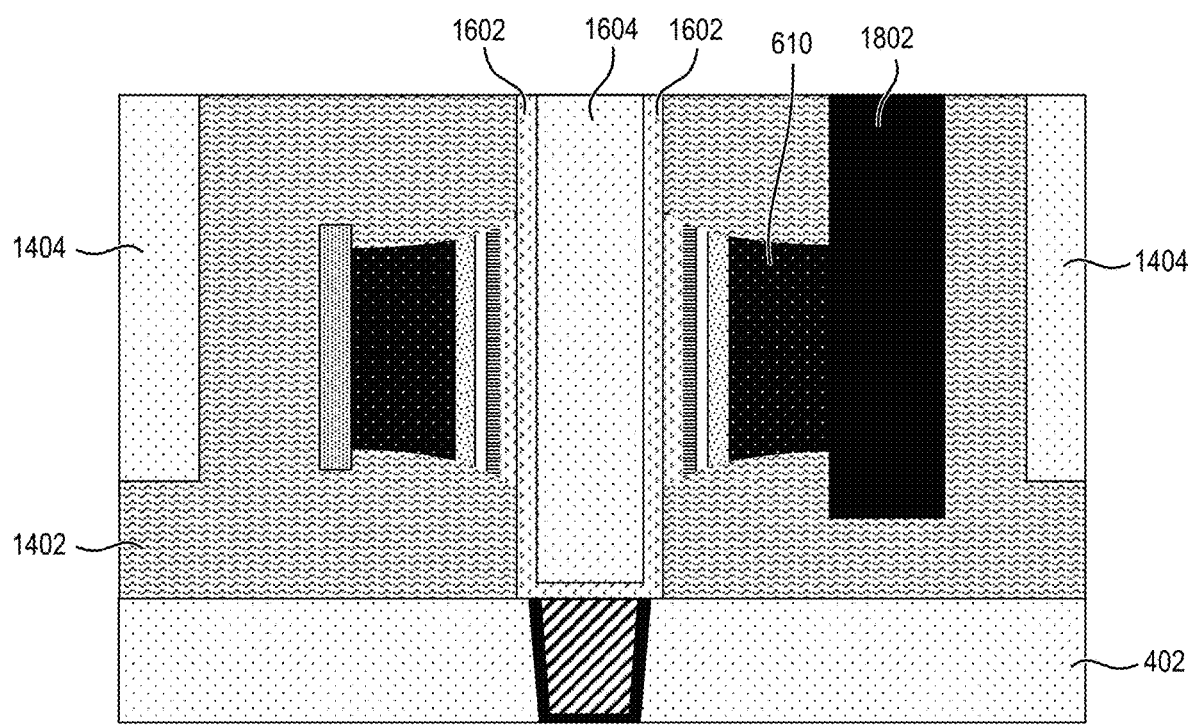

FIG. 18 depicts the fabrication of an MTJ device contact 1802, which is preferably formed using a contact metallization process, in one or more embodiments. During the metallization process, a metal layer 1802 is deposited over at least a portion of the wafer, filling the opening 1704. The metal layer 1802 may comprise, for example, Ta, Ti, TaN, TiN, W, Ru, Co, Cu, or a combination thereof, although embodiments of the invention are not limited to any specific metal(s) forming the metal layer. The metal layer 1802 provides electrical contact with the metallic hard mask layer 610 and is thus referred to as an MTJ device contact.

CMP, or a similar planarization process, is then performed to remove any portions of the metal layer 1802 extending on the upper surface of the wafer outside the opening (1704 in FIG. 17) and to remove the photoresist layer (1702 in FIG. 17) from the upper surface of the wafer. As a result of CMP, the SOT metal extension 1602 and core dielectric material 1604 are exposed through the upper surface of the structure.

Figure 19:
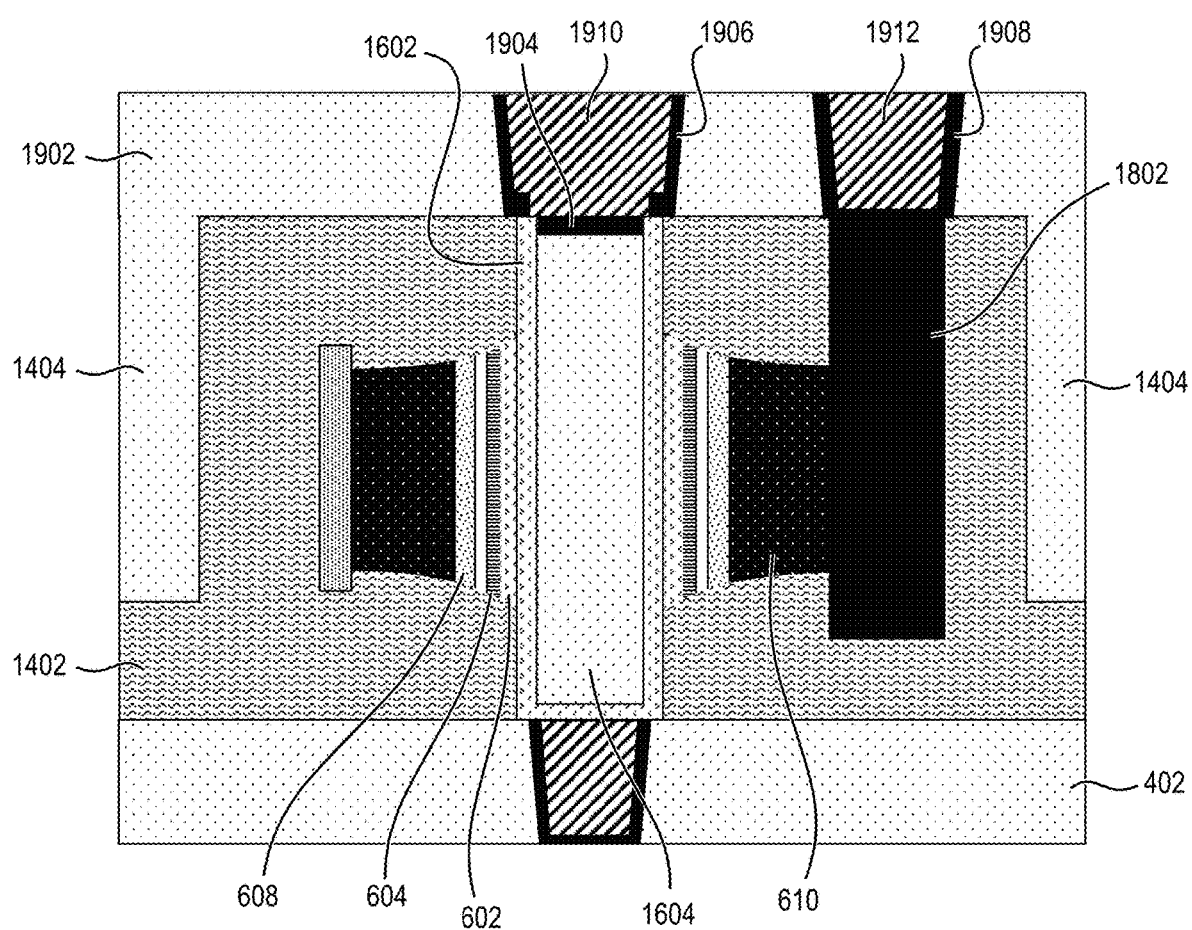

As shown in FIG. 19, an ILD layer 1902 is formed over the upper surface of the wafer such as by using a standard deposition process. The ILD layer 1902 may comprise the same dielectric material used to form the ILD structures 1404 (e.g., $SiO_x$, SiBCN, SiN, or a combination thereof), although embodiments of the invention are not limited to any specific material and/or process for forming the ILD layer 1902.

With continued reference to FIG. 19, the ILD layer 1902 is patterned (e.g., using standard lithography and etching) to form openings through the ILD layer; a first opening exposing the SOT metal extension 1602 and core dielectric material 1604, and a second opening exposing the MTJ device contact 1802. A first metal liner 1906 is formed on sidewalls of the first opening and a second metal liner 1908 is formed on sidewalls of the second opening using, for example, a sidewall metallization process. The first and second openings are then filled with metal, or an alternative conductor, to form first and second contacts, 1910 and 1912, respectively. The first contact 1910 provides electrical connection with the free layer 604 of the MTJ device, via the SOT metal extension 1602 and SOT layer 602, and the second contact 1912 provides electrical connection with the reference layer 608 of the MTJ device, via the MTJ device contact 1802 and metallic hard mask 610. The first and second contacts 1910, 1912 and first and second metal liners 1906, 1908 may, in one or more embodiments, comprise Ta, Ti, TaN, TiN, W, Ru, Co, Cu, or a combination thereof, although embodiments of the invention are not limited to any specific conductor material. Furthermore, the contacts and metal liners need not be formed of the same material.

As previously stated, the MTJ device formed in accordance with one or more embodiments of the invention is arranged such that the various layers of the MTJ device are beneficially arranged concentrically around the central core dielectric material 1604 (acting as a nanowire conductor) in an all-around configuration. In this manner, the interface area between adjacent layers (e.g., between the free layer 604 and the SOT metal extension 1602) will be substantially increased compared to the circular area of a conventional MTJ stack. Furthermore, the circumferential magnetization of the free layer 604 in the all-around structure of the MTJ device achieves enhanced stability, which is advantageous.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having MTJ devices therein formed in accordance with one or more embodiments of the invention, such as, for example, magnetic random access memory (MRAM).

An integrated circuit in accordance with aspects of the present disclosure can be employed in essentially any memory storage application and/or electronic system, such as, but not limited to, MRAM devices, etc. Suitable systems for implementing embodiments of the invention may include, but are not limited to, data storage systems, etc. Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above," "below," "upper," "lower," "top" and "bottom" are used to indicate relative positioning of elements or structures to each other as opposed to absolute positioning.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A magnetic tunnel junction device, comprising:
a cylindrically-shaped pillar structure;
a first ferromagnetic layer disposed on a surface of at least a portion of the pillar structure, the first ferromagnetic layer having a magnetization that is changeable in the presence of at least one of an applied bias and heat;
a dielectric barrier disposed on a surface of at least a portion of the first ferromagnetic layer; and
a second ferromagnetic layer disposed on a surface of at least a portion of the dielectric barrier, the second ferromagnetic layer having a magnetization that is fixed;
wherein the first and second ferromagnetic layers and the dielectric barrier have an all-around structure such that the first and second ferromagnetic layers and the dielectric barrier layer concentrically surround each other and concentrically surround the pillar structure, wherein the pillar structure comprises:
a central insulator core having a major axis that is substantially vertical; and
a conductive shell disposed over at least a portion of the central insulator core along the major axis; and
wherein the first ferromagnetic layer is in electric contact with the conductive shell, and the first and second ferromagnetic layers and the dielectric barrier concentrically surround the conductive shell in a direction that is perpendicular to the major axis.

2. The magnetic tunnel junction device of claim 1, wherein the conductive shell comprises a spin orbit torque (SOT) metal.

3. The magnetic tunnel junction device of claim 2, wherein the SOT metal comprises at least one of tungsten, platinum and tantalum, and wherein a thickness of the SOT metal is about 2-20 nanometers.

4. The magnetic tunnel junction device of claim 1, wherein the central insulator core comprises at least one of silicon dioxide ($SiO_2$), silicon nitride (SiN) and silicon oxynitrate ($SiO_xN_y$).

5. The magnetic tunnel junction device of claim 1, wherein the central insulator core is about 20-100 nanometers in diameter and about 50-200 nanometers in height.

6. The magnetic tunnel junction device of claim 1, wherein the first ferromagnetic layer is toroidal in shape and comprises at least one of cobalt, iron and boron, the conductive shell passing through a center of the first ferromagnetic layer.

7. The magnetic tunnel junction device of claim 1, wherein the dielectric barrier is toroidal in shape and comprises at least one of magnesium oxide (MgO), aluminum oxide ($AlO_x$), and magnesium aluminate ($MgAlO_x$).

8. The magnetic tunnel junction device of claim 1, wherein the device is configured such that the magnetization of the first ferromagnetic layer switches as a function of a bias current flowing through the pillar structure.

9. The magnetic tunnel junction device of claim 1, wherein the pillar structure comprises a central nanowire insulator surrounded by a conductive shell, the nanowire insulator being oriented along a major axis of the pillar structure.

10. The magnetic tunnel junction device of claim 1, wherein an interface area of the magnetic tunnel junction device is determined as $2\pi rh$, where r is a radius of the pillar structure and h is a height of the first ferromagnetic layer, a switching efficiency of the magnetic tunnel junction device being controlled as a function of the interface area.

11. A method of forming a magnetic tunnel junction device having an all-around structure comprises:
forming a cylindrically-shaped pillar structure;
forming a first ferromagnetic layer on a surface of at least a portion of the pillar structure, the first ferromagnetic layer having a magnetization that is changeable in the presence of at least one of an applied bias and heat;
forming a tunneling barrier on a surface of at least a portion of the first ferromagnetic layer; and
forming a second ferromagnetic layer on a surface of at least a portion of the tunneling barrier, the second ferromagnetic layer having a magnetization that is fixed;
wherein the first and second ferromagnetic layers and the tunneling barrier concentrically surround each other and concentrically surround the pillar structure, and wherein forming the pillar structure comprises:

depositing an amorphous silicon layer on an upper surface of at least a portion of a metal connection formed in a dielectric material layer;

depositing a hard mask layer on a portion of an upper surface of the amorphous silicon layer, the hard mask layer and the amorphous silicon layer forming a dummy core;

etching the dummy core to form the pillar structure which is cylindrical in shape; and depositing a layer of spin orbit torque (SOT) metal on at least a portion of an upper surface of the dielectric material layer and sidewalls and an upper surface of the dummy core.

12. The method of claim 11, wherein forming the first ferromagnetic layer comprises depositing a layer of at least one of cobalt, iron and boron on at least a portion of an upper surface of the SOT metal.

13. The method of claim 12, wherein forming the tunneling barrier comprises depositing at least one of a layer of magnesium oxide (MgO), aluminum oxide ($AlO_x$), and magnesium aluminate ($MgAlO_x$) on at least a portion of an upper surface of the first ferromagnetic layer.

14. The method of claim 13, wherein forming the second ferromagnetic layer comprises depositing at least one of a layer of cobalt, iron, boron, platinum, nickel, tungsten and iridium.

15. The method of claim 11, further comprising forming a metallic hard mask layer on at least a portion of an upper surface of the second ferromagnetic layer.

16. The method of claim 15, further comprising:
removing portions of the metallic hard mask layer formed on horizontal surfaces of the second ferromagnetic layer;

forming a dummy dielectric layer on horizontal surfaces of the magnetic tunnel junction device; and forming a conformal dielectric layer over an upper surface of the magnetic tunnel junction device.

17. The method of claim 16, further comprising:
performing reactive ion etching to remove portions of the conformal dielectric layer formed on horizontal surfaces of the magnetic tunnel junction device;

recessing the conformal dielectric layer remaining on sidewalls of the pillar structure thereby exposing a portion of the dummy dielectric layer formed on an upper surface of the pillar structure and exposing a top portion of the metallic hard mask layer disposed on sidewalls of the pillar structure;

removing portions of the dummy dielectric layer formed on the upper surface of the pillar structure and not covered by the conformal dielectric layer; and performing selective etching to remove remaining portions of the dummy dielectric layer disposed under the conformal dielectric layer.

18. The method of claim 17, further comprising:
removing portions of the metallic hard mask layer not protected by the conformal dielectric layer;

removing portions of the first and second ferromagnetic layers and tunneling barrier not protected by remaining portions of the metallic hard mask layer;

forming an encapsulation layer surrounding the magnetic tunnel junction device; and forming electrical contacts with the second ferromagnetic layer and the pillar structure.

* * * * *